United States Patent
Dawe

(10) Patent No.: US 6,483,871 B1
(45) Date of Patent: Nov. 19, 2002

(54) PHASE DETECTOR WITH ADJUSTABLE SET POINT

(75) Inventor: Piers James Geoffrey Dawe, Sawbridgeworth (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/221,777

(22) Filed: Dec. 28, 1998

(51) Int. Cl.[7] .................................................. H04B 3/46
(52) U.S. Cl. ........................ 375/226; 375/375; 375/376; 327/12
(58) Field of Search .................................. 375/226, 375, 375/376; 331/1 A; 327/12

(56) References Cited

U.S. PATENT DOCUMENTS

| | | | |
|---|---|---|---|
| 4,434,407 A | * 2/1984 | Healey, III et al. | 331/4 |
| 5,250,913 A | 10/1993 | Gleichert | 331/25 |
| 5,455,540 A | * 10/1995 | Williams | 331/1 A |
| 5,824,606 A | * 10/1998 | Dible et al. | 438/729 |
| 6,041,642 A | * 3/2000 | Duncan | 73/24.01 |
| 6,151,356 A | * 11/2000 | Spagnoletti et al. | 375/226 |

OTHER PUBLICATIONS

Journal of Lightwave Technology. vol. LT–3.No. 6, Dec. 1985 —"A Self Correcting Clock Recovery Circuit"— Charles R Hogge Jr. (ref:p. 2 last para.).

* cited by examiner

*Primary Examiner*—Stephen Chin
*Assistant Examiner*—David B. Lugo
(74) *Attorney, Agent, or Firm*—Lee, Mann, Smith, McWilliams, Sweeney & Ohlson

(57) ABSTRACT

A digital signal phase detector comprising a first circuit arranged to provide a phase difference signal representative of both the clock period of a clock signal and the difference in phase between the clock and a data signal, and a second circuit arranged to provide a reference signal representative of the clock period of the clock signal. At least one of the first and second circuits is coupled to a set point control signal and the corresponding output signal is representative of that set point control signal. A comparison of the phase difference signal with the reference signal provides an indication of the difference between the desired set point of the circuit and the phase difference between the clock and the data signal. A corresponding method of digital signal phase detection is also provided.

26 Claims, 10 Drawing Sheets

PHASE DETECTOR WITH ADJUSTABLE SET POINT

FIELD OF THE INVENTION

The present invention relates to a method and apparatus for electrical signal phase detection and a system incorporating the same.

BACKGROUND TO THE INVENTION

Digital communication equipment is used in a wide variety of devices for the transmission of digital information. Such information includes numerical data in computers and digital encodings of voice in telecommunications systems.

In the course of transmission of digital signals from a transmitter to a receiver, the digital signals tend to become degraded. Degradation may involve loss of overall strength of the signal, and loss of definition of the pulse edges: at the time of sending, the pulse edges typically rise and fall sharply with respect to the overall pulse length giving a cleanly defined shape to the pulse whilst, at the receiver, the rate of rise and fall of the pulses tends to decrease resulting in less sharply defined pulses. In order to correct for these degradations, it is common practice to regenerate the original digital signal from the distorted one at the receiving end of a digital communication link. The regenerated signal may then be retransmitted along a further transmission link or be further processed locally.

To regenerate a received signal, typically, the receiver must ensure that the received data signal (the data signal) is processed synchronously relative to a local clock signal (the clock signal). It is also desirable to ensure that the data signal is not sampled near the degraded edges of the received data pulses which would lead to incorrect interpretation of the signal. Typically a phase locked loop would be used, containing a phase detector, an adjustable oscillator, and feedback circuit so that the receiver tends to a target clock-to-data phase relationship (the set point) which is not easily adjustable.

Alternatively in some circumstances a delay locked loop could be used, comprising a phase detector, a clock signal source, an adjustable delay in the clock or data path, and feedback circuit so that the receiver tends to a target clock-to-data phase relationship (the set point) which typically is not easily adjustable.

The target relationship may not be optimum, for example where the eye of the received data signal is asymmetrical.

It is known to make a compensating adjustment by means of one or more delays introduced into one or more paths leading from the clock signal or data signal to the phase detector or decision circuit. This has the disadvantage that it requires the delay circuitry to operate at the full speed of the clock or data signal, with associated hardware costs, power consumption, and crosstalk which can act to degrade the data or clock signal before it reaches the decision circuit and/or phase detector.

It is also known to add an offset in the phase locked or delay locked loop, for example by adding a voltage to the phase detector output, thereby directly affecting the loop feedback input signal. This has the disadvantages of being susceptible to pattern-dependent jitter, and operating only over a limited phase range.

A clock-to-data phase detector is a device which takes as two of its inputs a data signal and a clock signal and generates signals giving information about the phase difference between the data signal and clock signal. A known means of representing the phase difference information is by means of a pair of signals: the first signal (the phase difference signal) comprises a component which represents the phase difference and a further component which represents the variations in the number of edges occurring in the data; the second signal (the reference signal) represents only the latter variation. Subsequent subtraction of the reference signal from the phase signal gives a signal (the difference signal) representing the difference in phase.

It is known [from C. R. Hogge, "A Self Correcting Clock Recovery Circuit", Journal of Lightwave Technology, Vol. LT-3, No. 6, December 1985] to generate a phase difference signal employing circuitry constructed using silicon components, whilst at the same time generating a reference signal by employing a fixed delay introduced by means of a delay line.

U.S. patent application Ser. Nos. 08/847,426 and 09/156,019 (Continuation-in-part) provide an improved method and apparatus for detecting the phase difference between a digital data signal and a clock signal. By ensuring that no pulse in the output phase signal is narrow enough to introduce a non-linearity, a source of non-linearity exhibited in previous known phase detectors is avoided. In addition, by ensuring that critical timing paths through the circuit contain similar circuit blocks, with similar propagation delays, relative time relationships are preserved from clock and data inputs to XOR inputs. The circuit is therefore largely insensitive to changes in the characteristics of the components so long as they all move together, as they would in an integrated circuit implementation.

U.S. Pat. No. 5,250,913 provides a phase detector for a phase locked loop for bit clock retrieval where the phase detector employs a plurality of variable unit delays and has a constant gain region that is a percentage of the clock period over an extended frequency range of the VCO enabling a single chip to operate for several applications at widely different frequencies.

OBJECT TO THE INVENTION

The invention seeks to provide an improved method and apparatus for detecting the phase difference between a digital data signal and a clock signal.

SUMMARY OF THE INVENTION

According to a first aspect of the present invention there is provided a digital signal phase detector comprising: a data signal input for receiving a data signal; a clock signal input for receiving a clock signal; a set point control signal input for receiving a set point control signal indicative of a desired set point of the detector; a first circuit coupled to said data signal input and said clock signal input and arranged to provide a phase difference signal representative of both the clock period of the clock and the difference in phase between the clock and the data signal; a second circuit coupled to said data signal input and the clock signal input and arranged to provide a reference signal representative of the clock period of the clock signal; wherein at least one of said first and second circuits is coupled to said set point control signal and the corresponding output signal is representative of said set point control signal; and wherein a comparison of the phase difference signal with the reference signal provides an indication of the difference between the desired set point of the circuit and the phase difference between the clock and the data signal.

Advantageously, where the eye of the received signal is asymmetrical, the sampling point can be offset to the optimal sampling position.

Advantageously, whilst certain undesired delays may exist within a phase detector circuit or in circuitry leading to it, these can be compensated for.

Advantageously, the delay elements are arranged to act on regenerated digital signal pulses. The height and speed of such pulses are more predictable than those of the unregenerated data signal, and consequently the delay circuits work better.

Advantageously, the circuitry in the data and clock paths leading to the phase detector is minimised, thereby reducing power consumption, crosstalk, and improving overall performance.

Advantageously, the phase difference and reference signal pulses can be made to overlap whereby to reduce the data content to be filtered out of the error signal, thereby improving performance.

Preferably, the phase detector is arranged such that timing of pulse edges in said output signal of said at least one of said first and second circuits varies responsive to said set point control signal.

Preferably, said one of said first and second circuits comprises a first adjustable delay circuit coupled to said set point control signal, and arranged to introduce a signal delay responsive to said set point control signal, whereby to render the corresponding output signal of said one of said first and second circuits representative of said set point control signal.

Preferably, each of said first and second circuits comprises an adjustable delay circuit coupled to said set point control signal, and arranged to introduce a signal delay responsive to said set point control signal, whereby to render the output signal of each of said first and second circuits representative of said set point control signal.

Preferably, said adjustable delay circuits are arranged to introduce oppositely-varying delays responsive to said set point control signal.

Preferably, said one of said first and second circuits comprises a second adjustable delay circuit coupled to said set point control signal, and arranged to introduce a signal delay responsive to said set point control signal.

Preferably, said adjustable delay is arranged to introduce a delay of less than half of a clock cycle.

In one preferred embodiment, said adjustable delay receives a signal having pulse lengths greater than that of the input data signal.

Preferably, said adjustable delay receives a signal having a pulse length at least twice that of the input data signal.

Advantageously, delay elements may run slower than the line rate or line clock-rate: the pulse length to be delayed is typically twice the line pulse length, as opposed to the line pulse length if the data signal is delayed or half the pulse length if the clock signal is delayed.

Preferably the phase detector circuit comprises: a data-reduction circuit arranged to provide a reduced data signal which changes state upon receipt of either only rising or only falling state transitions in a digital input signal; a resynchronisation circuit arranged to provide a resynchronised reduced data signal upon receipt of a clock input signal and the reduced data signal; a first shift register circuit arranged to provide a first phase-shifted resynchronised reduced data signal upon receipt of the resynchronised reduced data signal and one or more clock signals; a second shift register circuit arranged to provide a second phase-shifted resynchronised reduced data signal upon receipt of the first phase-shifted resynchronised reduced data signal and one or more clock signals; a first Exclusive OR circuit arranged to provide a phase difference signal upon receipt of the reduced data signal and the first phase-shifted resynchronised reduced data signal; and a second Exclusive OR circuit arranged to provide a reference signal upon receipt of the resynchronised reduced data signal and the second phase-shifted resynchronised reduced data signal; an adjustable delay circuit arranged to provide a variably delayed output signal upon receipt of an input signal, responsive to a set point control signal; and wherein said adjustable delay circuit is arranged to delay one of said reduced data signal, said resynchronised reduced data signal, said first phase-shifted resynchronised reduced data signal, and said second phase-shifted resynchronised reduced data signal.

Preferably, the data-reduction circuit comprises a D-Type flip flop; the resynchronisation circuit comprises a D-Type flip flop; the first shift register circuit comprises a Latch; the second shift register circuit comprises a Latch; the first XOR circuit comprises an XOR gate; and the second XOR circuit comprises an XOR gate.

In a preferred embodiment the phase detector circuit comprises: a second adjustable delay circuit arranged to provide a variably delayed output signal upon receipt of an input signal, responsive to a set point control signal; and wherein said adjustable delay circuit and said second adjustable delay circuit are each arranged to delay a distinct one of said reduced data output signal, said resynchronised reduced data signal, said first phase-shifted resynchronised reduced data signal, and said second phase-shifted resynchronised reduced data signal.

Preferably, said adjustable delay circuit and said second adjustable delay circuits are arranged to introduce oppositely varying delays responsive to said set point control signal.

Preferably, said adjustable delay circuit is arranged to delay said reduced data signal and said second adjustable delay circuit is arranged to delay said first phase-shifted resynchronised reduced data signal.

Preferably, said first and second adjustable delay circuits are arranged to introduce oppositely varying delays responsive to said set point control signal.

According to a further aspect of the present invention there is provided a phase-locked loop circuit having a set point and comprising: a phase detector circuit according to claim 1; a loop filter and adjustable oscillator circuit arranged to provide said clock signal responsive to receipt of an output signal from said phase detector; and wherein the set point of said phase-locked loop circuit is responsive to said set point control signal.

Preferably, said loop filter and adjustable oscillator circuit comprises: a subtractor circuit which provides a difference signal output responsive to said phase difference and reference signals; a loop filter circuit which provides a filter output signal responsive to said difference signal; an adjustable clock signal circuit which provides said clock signal responsive to said filter output signal.

According to a further aspect of the present invention there is provided a delay-locked loop data re-timing circuit comprising: a phase detector circuit according to claim 1; a decision circuit arranged to provide a re-timed data signal upon receipt of said clock signal and said data signal; and a feedback circuit arranged to receive said phase difference signal, said reference signal, and said data signal and to delay said data signal responsive to said phase difference signal and said reference signal, whereby to control the phase of said data signal prior to its delivery to said phase detector circuit and said decision circuit and to vary the set point of the phase detector.

According to a further aspect of the present invention there is provided a phase-locked loop data re-timing circuit comprising: a phase detector circuit according to claim 1; a decision circuit arranged to provide a re-timed data signal upon receipt of said clock signal and said data signal; and a feedback circuit arranged to receive said phase difference signal and said reference signal and to provide said clock signal to said phase detector circuit and said re-timing circuit responsive to said phase difference signal and said reference signal, whereby to control the phase of said clock signal prior to its delivery to said phase detector circuit and said decision circuit and to vary the set point of the phase detector.

Advantageously, the decision circuit works best if there is a time offset between the clock edges and where the actual decision point is.

Advantageously, certain undesired delays in, or leading to, the decision circuit may also be compensated for.

According to a further aspect of the present invention there is provided a system for the purposes of digital signal processing comprising a circuit according to any foregoing aspect of the present invention.

The invention is also directed to the methods by which each of the described apparatus operates and including method steps for carrying out every function of the apparatus.

According to a further aspect of the present invention there is provided a method of digital signal phase detection comprising the steps of: providing a data signal; providing a clock signal; providing a set point control signal indicative of a desired set point; providing a phase difference signal responsive to and representative of both the period of the clock signal and the difference in phase between the clock signal and the data signal; providing a reference signal responsive to and representative of the period of the clock signal; wherein at least one of said phase difference signal and reference signal is also responsive to and representative of said set point control signal; and comparing the phase difference signal with the reference signal whereby to provide an indication of the difference between the desired set point and the phase difference between the clock and the data signal.

Preferably, each of said phase difference signal and reference signal is responsive to and representative of said set point control signal.

Preferably, the signal pulse edge timing of at least one of said phase difference signal and reference signal is responsive to and representative of said set point control signal.

Preferably, timing of rising pulse edges and falling pulse edges of said at least one of said phase difference signal and reference signal varies oppositely responsive to said set point control signal.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Figure 1:
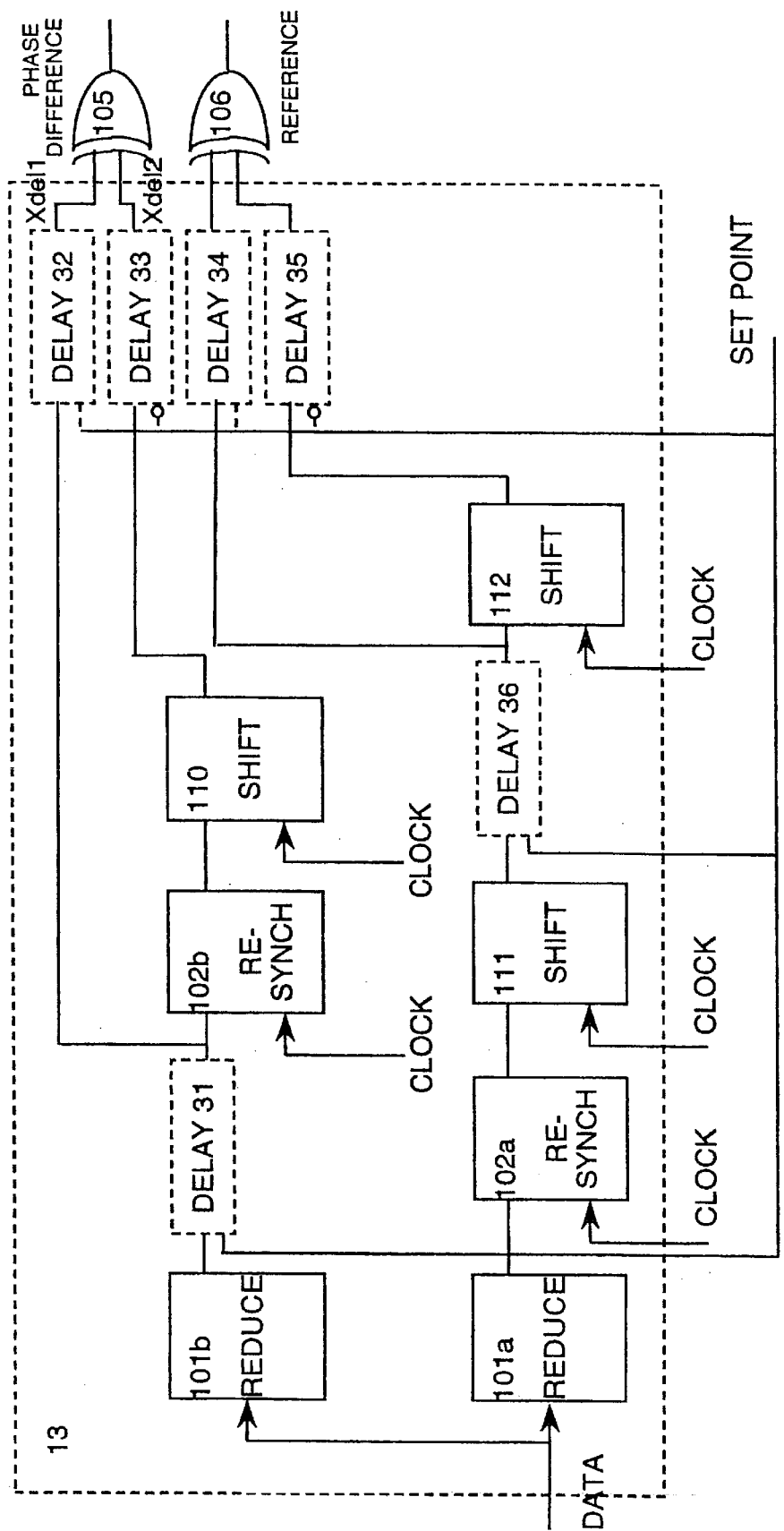
FIG. 1 shows a block diagram of a first phase detector circuit in accordance with the present invention.

A circuit diagram of a first embodiment of a phase detector 13 in accordance with the present invention is shown in FIG. 1 comprising: first and second data reduction circuits 101a and 101b, first and second resynchronisation circuits 102a and 102b, first, second and third shift register circuits 111, 110 and 112, the first, second, third, fourth, fifth and sixth settable delays 31–36, and first and second Exclusive OR (XOR) gates 105, 106. At least one, but not necessarily all of the settable delays 31–36 must be present.

The first data reduction circuit 101a takes as input a data signal. The first resynchronisation circuit 102a takes as input the output from the first data reduction circuit 101a and a clock signal. The first shift register circuit 111 takes as input the output from the first resynchronisation circuit 102a and a clock signal phase shifted by an amount A. The third shift register circuit 112 takes as input the output from the first shift register circuit 111 (via settable delay 36) and a clock signal phase shifted by an amount A+B.

The second data reduction circuit 101b takes as input a data signal. The second resynchronisation circuit 102b takes as input the output from the second data reduction circuit (via settable delay 31) and a clock signal. The second shift register circuit 110 takes as input the output from the second resynchronisation circuit 102b and a clock signal phase shifted by an amount C.

The XOR gate 105 takes as input the output from the second data reduction circuit 101b via settable delays 31 and 32 and the output from the second shift register circuit 110 via settable delay 33. XOR gate 106 takes as input the output from the first and third shift register circuits 111, 112 via settable delays 36 plus 34, and 35 respectively.

The data reduction circuits 101a, 101b are each operable to produce a reduced data digital output signal which changes state responsive only to the receipt of positive-going state changes or only to the receipt of negative going state changes in the data signal. This reduces the speed requirements of subsequent parts of the apparatus since the frequency of state changes in the output signal is at most half that in the received data signal. Where the output signal does not change state upon receipt of every positive going or negative-going state change, the frequency of state changes in the output signal will be reduced still further. The resynchronisation circuits 102a, 102b are each operable to receive a clock signal at a first input and, at a second input, an output from the corresponding data reduction circuit (optionally delayed by settable delay 31 in the case of resynchronisation circuit 102b) and to provide a resynchronised reduced data signal.

The first shift register circuit 111 is operable to receive a clock signal phase shifted by an amount A at a first input and, at a second input, an output from the first resynchronisation circuit. and to provide a resynchronised reduced data signal delayed by an amount A.

The third shift register circuit 112 is operable to receive a clock signal phase shifted by an amount A+B at a first input, and at a second input, an output from the first shift register circuit 111, optionally delayed by settable delay 36, and to provide a resynchronised reduced data signal delayed by an amount A+B.

The second shift register circuit 110 is operable to receive a clock signal phase shifted by an amount C at a first input, and at a second input, an output from the second resynchronisation circuit 102b and to provide a resynchronised reduced data signal delayed by an amount C.

The XOR gate 105 is operable to generate a phase difference signal being the exclusive-OR of the reduced data signal produced by the second data reduction Act circuit 101b and fed via optional settable delays 31 and 32 and the delayed resynchronised reduced data signal produced by the second shift register circuit 110 and fed via settable delay 33.

The XOR gate 106 is operable to generate a reference signal being the exclusive-OR of the resynchronised reduced data signal output from the first shift register circuit 111 and fed via optional settable delays 36 and 34 and the resynchronised reduced data signal delayed by an amount A+B produced by the shift register circuit 112 and fed via settable delay 35.

The difference between the phase difference signal and the reference signal varies linearly with the phase difference between the data signal and the clock signal.

XOR gate 106 compares the edges of the optionally delayed signals output from the first shift register circuit 111 and the second shift register 112, to give a signal the duration of whose pulses is dependent only on the clock period and the amount of delay introduced by settable delays 34–36. Pulse durations are as measured between the half-height points of the pulses. The frequency with which these pulses occur is dependent on the frequency of occurrence of rising (or falling) edges in the data signal received by the first data-reduction circuit 101a.

XOR gate 105 compares the edges of the optionally delayed signals output from the second data reduction circuit 101b and the second shift register 110, giving rise to a signal having pulse widths dependant on the clock period, the amount of delay introduced by-settable delays 31–33, and on the difference in phase between the clock signal and the data signal received by the second data reduction circuit 101b. The use of the shift register to phase-shift the signal to one of the inputs of XOR gate 105 by an amount C means that the pulses in the signal output from XOR gate 105 vary in duration from C to C+1 clock cycles. Preferably, C is 0.5 clock cycles or greater.

By comparing the pulse durations at the outputs of the two XOR gates 105, 106 it is possible to measure the phase difference between the clock signal and the data signal. This comparison may be done by subtracting and integrating the two signals to give a difference signal. The difference signal so generated varies linearly with the phase difference between clock and data.

The difference in phase between the clock signal and the data signal input to the phase detector when the difference signal is zero is known as the set point. In the absence of settable delays 31–36 the set point will tend towards zero. In practice, however, it may be desirable to set the set point to a non-zero value to compensate for the fact that the eye of the received data signal may not be symmetrically positioned with respect to the phase cycle of the data signal. Typically the eye will be centred at a point just ahead of the mid-point of the data phase cycle, though the precise offset will vary according to the characteristics of the originating transmitter and the medium through which the received data signal is propagated. It is therefore desirable to be able to vary the set point according to the precise position of the eye for each given received signal.

The ability to vary the set point has a number of advantages. Firstly, where the eye of the received signal is asymmetrical, the sampling point may be offset to the optimal sampling position. Further, certain undesired delays may exist within a phase detector circuit or in circuitry leading to it, and these can be compensated for.

Figure 2:
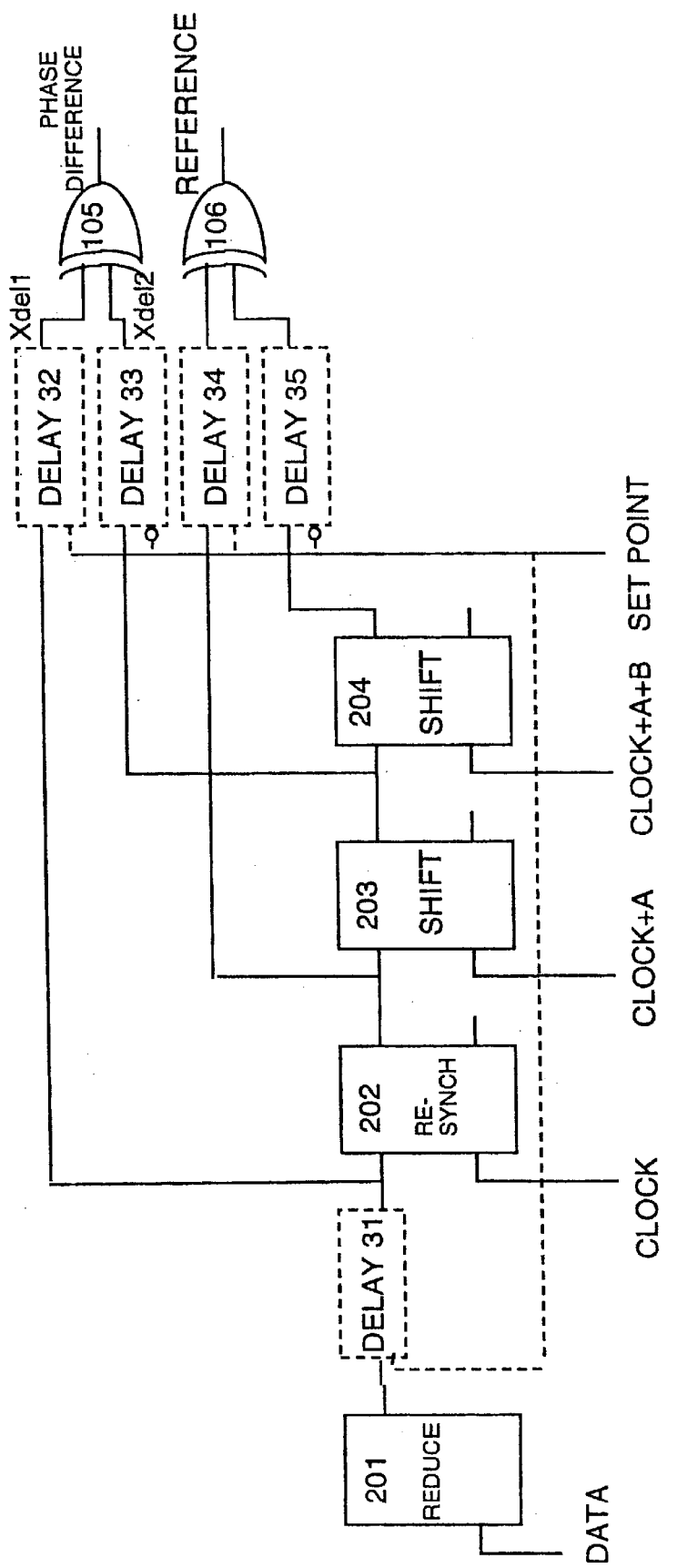
FIG. 2 shows a block diagram of a second phase detector circuit in accordance with the present invention.

A circuit diagram of a further embodiment of a phase detector 13 in accordance with the present invention is shown in FIG. 2, comprising: a data reduction circuit 201, a resynchronisation circuit 202, a first shift register circuit 203, a second shift register circuit 204, first and second Exclusive OR (XOR) gates 105, 106 and first, second, third, fourth, and fifth settable delay elements 31–35. At least one, but not necessarily all of the settable delays 31–35 must be present.

The data reduction circuit 201 takes as input a data signal, and feeds its output via the first delay element 31 to the resynchronisation circuit 202 which also receives a clock signal as a further input. The first shift register circuit 203 takes as inputs the output from the resynchronisation circuit 202 and a clock signal phase-shifted by an amount A. The second shift register circuit 204 takes as inputs the output from the first shift register circuit 203 and a clock signal phase-shifted by an amount A+B.

The first XOR gate 105 takes as inputs the output from the data reduction circuit 201, passed via the first delay element 31 and the second delay element 32 and the output from the first shift register circuit 203 passed via the third delay element 33. The second XOR gate 106 takes as inputs the output from the resynchronisation circuit 202 via the fourth delay element 34 and the output from the second shift register circuit 204 via the fifth delay element 35.

The data-reduction circuit 201 is operable to produce a reduced data digital output signal which changes state responsive only to the receipt of positive-going state changes or only to the receipt of negative going state changes in the data signal. This reduces the speed requirements of subsequent parts of the apparatus since the frequency of state changes in the output signal is at most half that in the received data signal. Where the output signal does not change state upon receipt of every positive-going or negative-going state change, the frequency of state changes in the output signal will be reduced still further.

The resynchronisation circuit 202 is operable to receive a clock signal at a first input and, at a second input, an output from the data-reduction circuit and to provide a resynchronised reduced data signal.

The first shift register circuit 203 is operable to receive a clock signal phase shifted by an amount A at a first input and, at a second input, an output from the resynchronisation circuit 202 and to provide a resynchronised reduced data signal delayed by an amount A. (In the example illustrated A has been chosen as half a cycle so that the signal received by the shift register is $\overline{\text{clock}}$.)

The second shift register circuit 204 is operable to receive a clock signal phase shifted by an amount A+B at a first input and, at a second input, an output from the first shift register circuit 203 and to provide a resynchronised reduced data signal delayed by an amount A+B. (In the example illustrated B has been chosen as a further half cycle so that the signal received by the second shift register is clock.)

In addition, each of the optional settable delay elements 31–35 receives as an input a set point signal, which may be the same signal distributed to each delay element as shown or distinct signals acting to provide suitable set point information.

The first XOR gate 105 is operable to generate a phase difference signal between the reduced data signal and the delayed resynchronised reduced data signal.

The second XOR gate 106 is operable to generate a reference signal being the difference between the resynchronised reduced data signal and the resynchronised reduced data signal delayed by an amount A+B.

The difference between the phase difference signal and the reference signal varies linearly with the phase difference between the data signal and the clock signal.

XOR gate 106 compares the edges of the optionally delayed signals output from the resynchronisation circuit 202 and the second shift register 204, to give a signal the duration of whose pulses is dependent on the clock period and the extent of delays 34 and 35. Pulse durations are as measured between the half-height points of the pulses. The frequency with which these pulses occur is dependent on the frequency of occurrence of rising (or falling) edges in the data signal received by the data-reduction circuit 201.

XOR gate 105 compares the edges of optionally delayed signals output from the data reduction circuit 201 and the first shift register 203, and provides a signal having pulse widths dependant both on the clock period and on the difference in phase between the clock signal and the data signal received by the data reduction circuit 201, and on the delays introduced by delays 31–33. The use of the shift register to phase-shift the signal to one of the inputs of XOR gate 105 by an amount A means that the pulses in the signal output from XOR gate 105 vary in duration from A to A+1 clock cycles.

By comparing the pulse durations at the outputs of the two XOR gates 105, 106 it is possible to measure the phase difference between the clock signal and the data signal. This comparison may be achieved by subtracting and integrating the two signals to give a difference signal.

In accordance with the present invention, at least one settable delay element is capable of introducing a non-zero delay into the respective portion of the circuit, but it is not necessary that all of the delay elements indicated in the example be present.

Although not shown in the example illustrated, additional optional delays could also be positioned in the circuit after resynchronisation circuit 202 and/or first shift circuit 203 analogously to the positioning of delay 31 after data reduction circuit 201, as would be apparent to a person skilled in the art.

Figure 3:
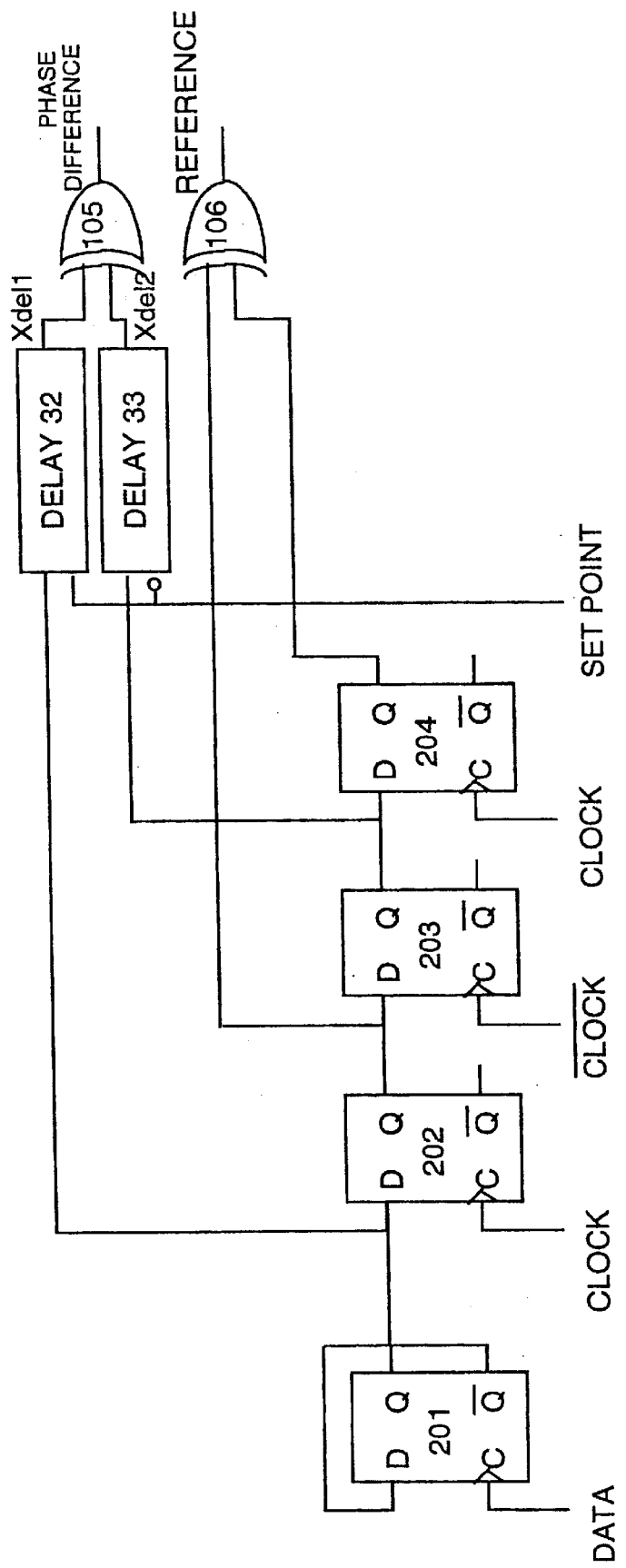
FIG. 3 shows a block diagram of a third phase detector circuit in accordance with the present invention.

In the specific embodiment shown in FIG. 3, the data-reduction circuit 201 and the resynchronisation circuit 202 are each implemented by a single D-Type flip flop, and both the first and second shift registers 203, 204 are implemented by a single latch. It is well known to construct a D-Type flip-flop from a pair of latches.

Delay elements 31, 34, and 35 are omitted (set to zero) from the circuit and delay elements 32 and 33 are present and adjustable in opposite directions responsive to receipt of the set point control signal.

Figure 4:
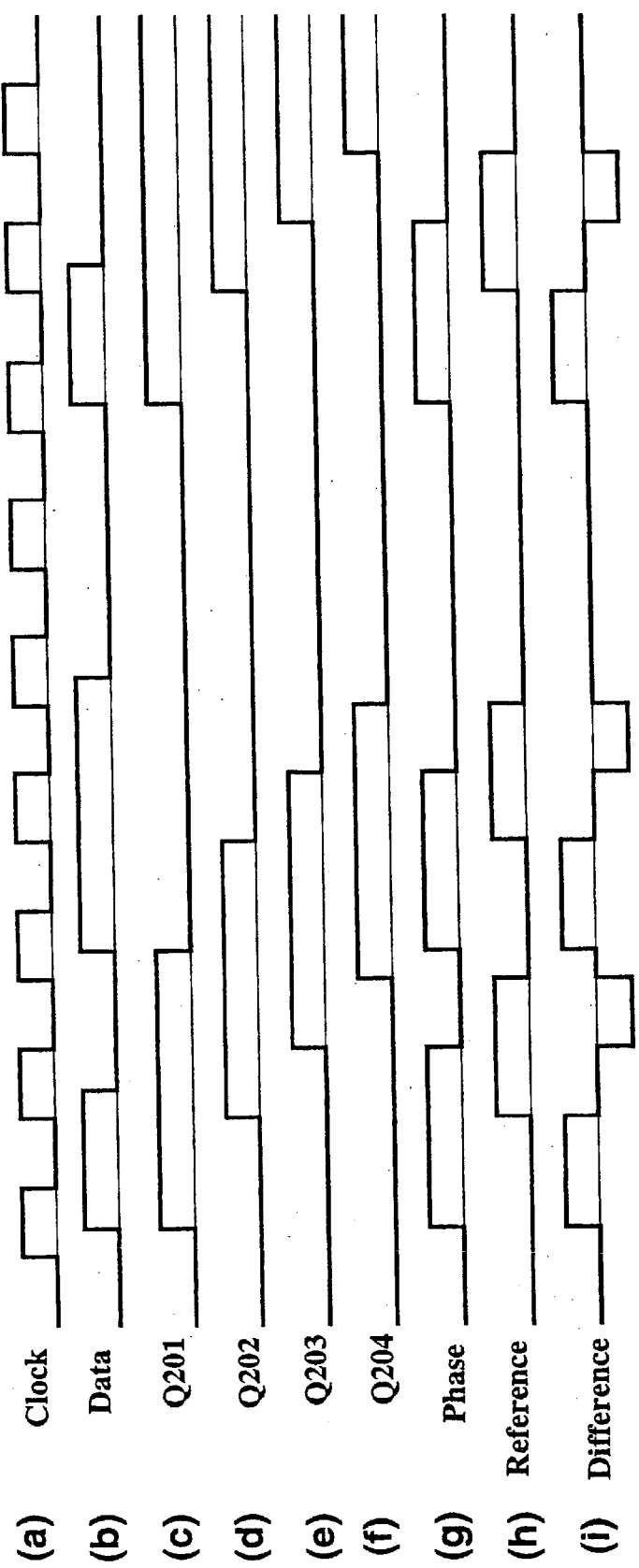
FIGS. 4(a–i) show examples of waveforms for the circuit shown in FIG. 3 with all delays set to zero.

Example signals at selected points in the circuit of FIG. 3 when all the delays are zero or omitted are shown in FIG. 4, corresponding to the case of a phase detector disclosed in U.S. Ser. No. 09/156,019. The signals shown are:

(a) an example clock signal,
(b) an example data signal,
(c) the 0201 output signal from D-Type flip flop 201,
(d) the Q202 output of D-Type flip flop 202,
(e) the Q203 output of latch 203,
(f) the Q204 output of latch 204,
(g) the phase difference signal output from XOR 105,
(h) the reference signal output from XOR 106, and
(i) the difference between signals 4(g) and 4(h).

Figure 5:
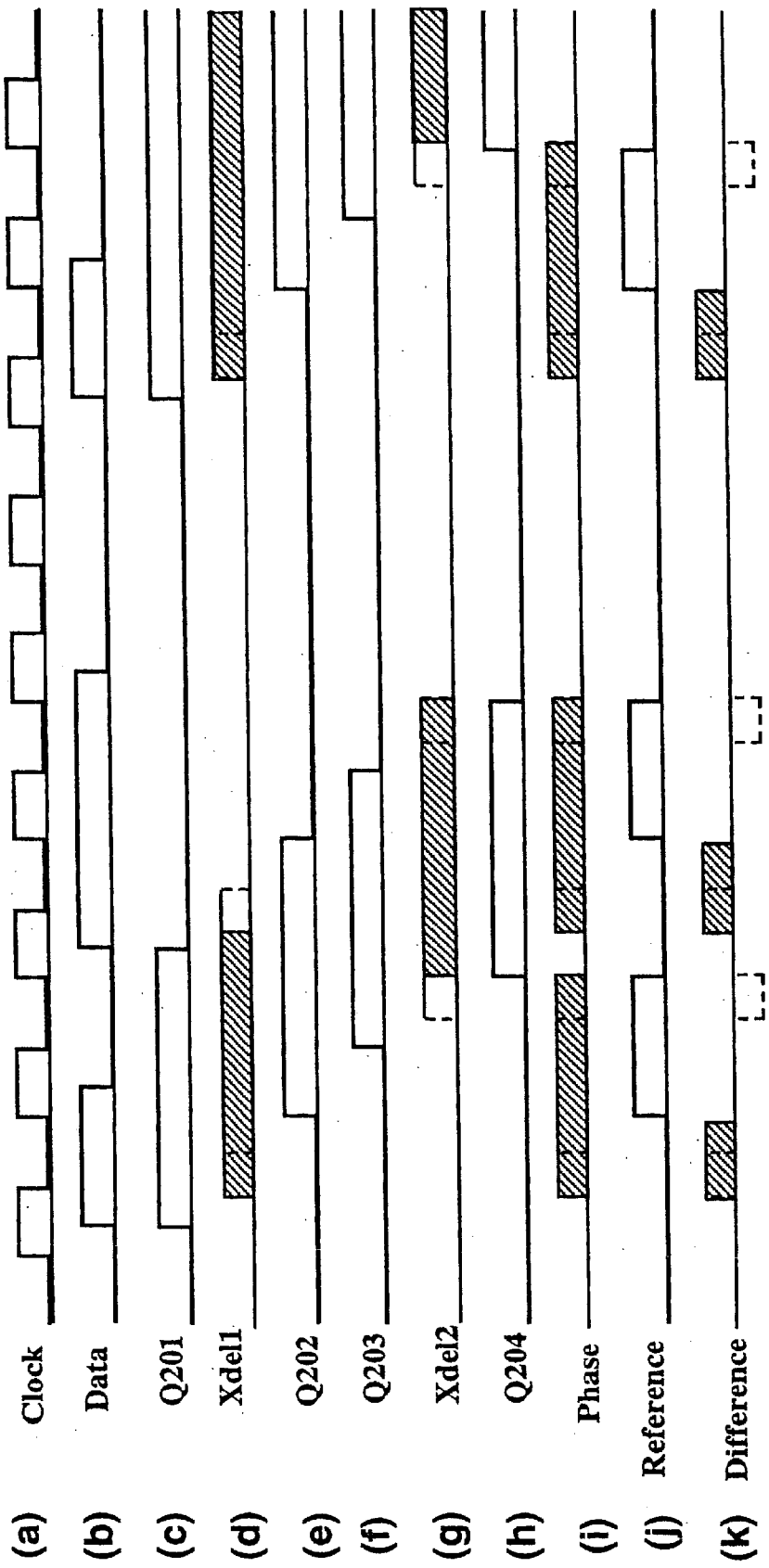
FIGS. 5(a–k) show an example of waveforms for the circuit shown in FIG. 3.

FIG. 5 shows an example set of waveforms corresponding to the circuit of FIG. 3, based on the same clock and data input signals illustrated in FIG. 4. The signals shown are (a) an example clock signal,
(b) an example data signal,
(c) the Q201 output signal from D-Type flip flop 201,
(d) Xdel1—signal 5(c) delayed by delay 32 by approximately one quarter of a clock cycle,
(e) the Q202 output of D-Type flip flop 202,
(f) the Q203 output of latch 203,
(g) Xdel2—signal 5(f) delayed by delay 33 by approximately ⅝ of a clock cycle,
(h) the Q204 output of latch 204,
(i) the phase difference signal output from XOR 105,
(j) the reference signal output from XOR 106, and
(k) the difference between signals 5(i) and 5(j)

The signal forms are shown for the case where delay 32 is set to approximately a quarter of a clock cycle and delay 33 is set to approximately ⅝ of a clock cycle, and illustrate a range of pulse lengths. In practice the delay values could vary over time but this is not illustrated within in this example.

The pulses in each of the delayed signals 5(d, g) and their dependent signals 5(i, k) are shown shaded. Broken lines are used to indicate the relative position of pulse edges as they occur in the related example shown in FIG. 6 (described below) which shows example signals for the same input signals, but for different delays introduced by settable delays 32, 33.

Figure 6:
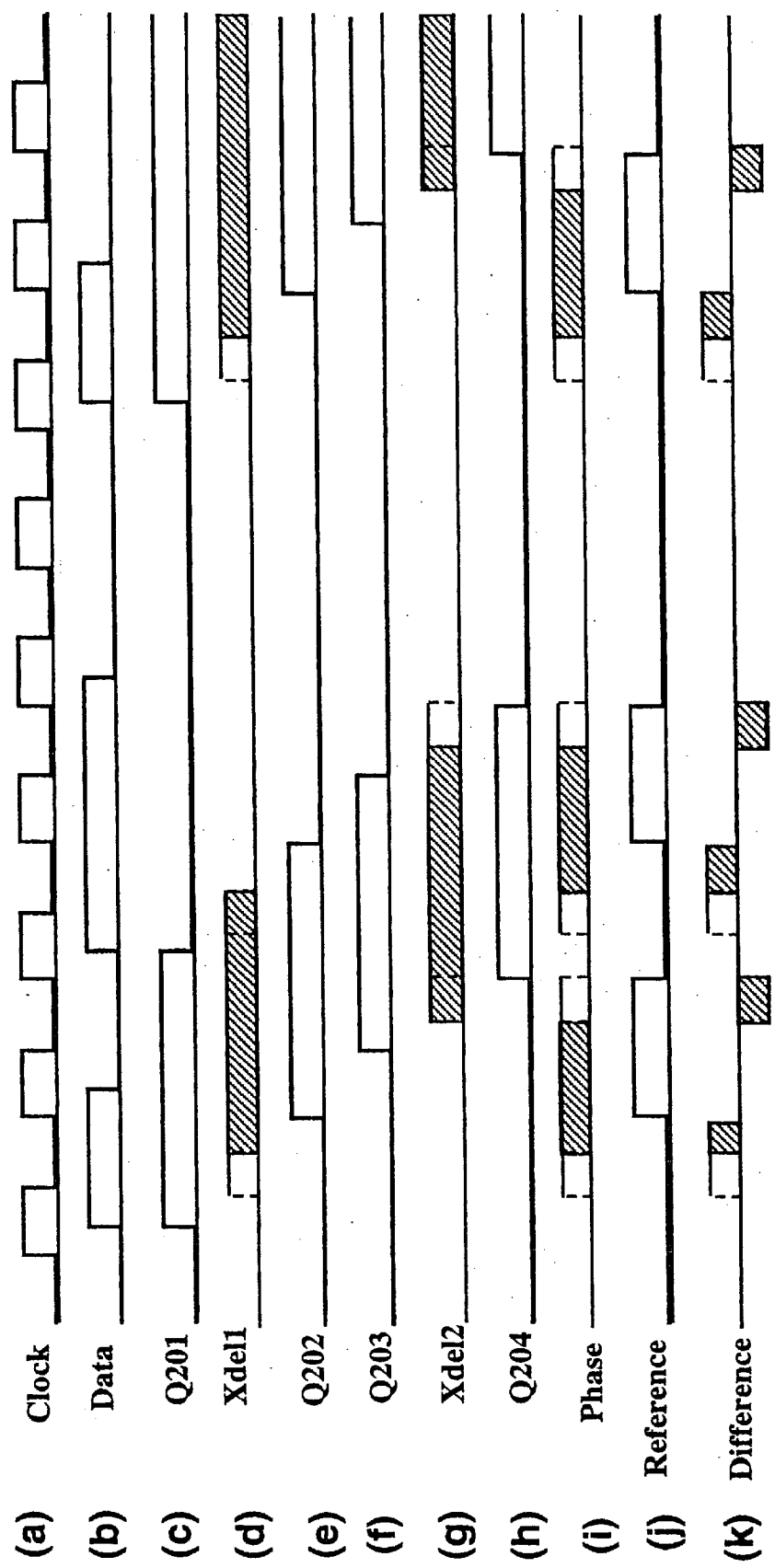
FIGS. 6(a–k) show a further example of waveforms for the circuit shown in FIG. 3.

FIG. 6 shows an example set of waveforms corresponding to the circuit of FIG. 3, based on the same clock and data input signals illustrated in FIG. 4, but for the case where delay 32 is set to approximately ⅝ of a clock cycle and delay 33 is set to approximately one quarter of a clock cycle.

The signals shown are (a) an example clock signal,
(b) an example data signal,
(c) the Q201 output signal from D-Type flip flop 201,
(d) Xdel1—signal 6(c) delayed by delay 32 by approximately ⅝ of a clock cycle,
(e) the Q202 output of D-Type flip flop 202, (f) the Q3 output of latch 203, (g) Xdel2—signal 6(f) delayed by delay 33 by approximately one quarter of a clock cycle, (h) the Q204 output of latch 204, (i) the phase difference signal output from XOR 105, (j) the reference signal output from XOR 106, and (k) the difference between signal 6(i) and 6(j)

The pulses in each of the delayed signals 6(d, g) and their dependent signals 6(i, k) are once again shown shaded. Broken lines are used to indicate the relative position of pulse edges as they occur in the related example shown in FIG. 5 and described above.

A comparison of the difference signals shown in FIGS. 5(k) and 6(k) shows how a variation in those signals can be achieved by adjustment of the settable delay signals responsive to a set point control signal.

Introduction of such adjustable delays according to the present invention within a phase detector circuit is applicable not only to phase detectors such as those of U.S. Ser. No. 09/156,019, but is also applicable to other forms of phase detectors including phase locked loop detectors and delay locked loop phase detectors.

Figure 7:
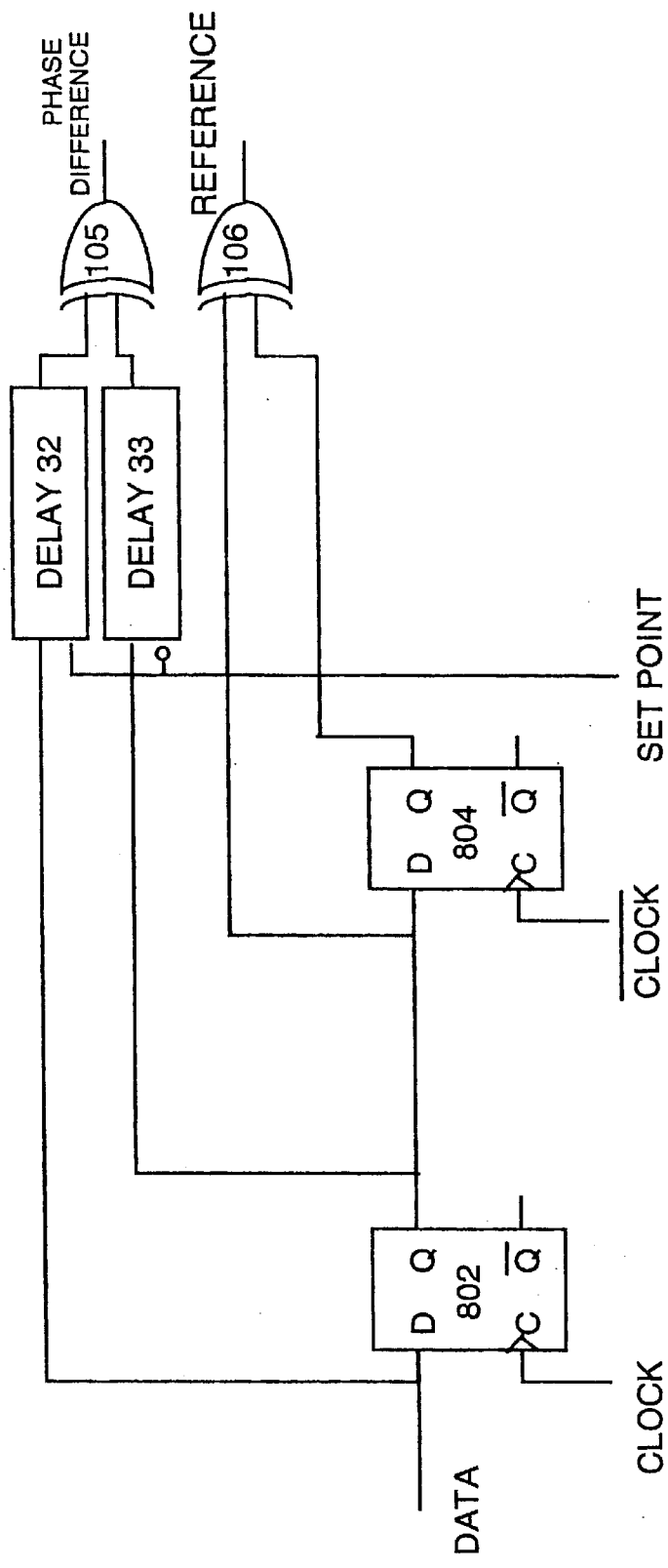
FIG. 7 shows a further phase detector circuit in accordance with the present invention.

A circuit diagram of a further embodiment of the present invention is shown in FIG. 7. The circuit is based on a phase detector circuit shown in [Hogge, ibid.], with adjustable delays added to permit adjustment of the set point of the circuit in accordance with the present invention.

The circuit comprises first and second D-Type flip flops 802, 804, first and second settable delays 32, 33, and first and second XOR gates 105, 106.

The first D-Type flip flop 802 receives as inputs a data signal and a clock signal. A signal output from the first D-Type flip flop is fed to the second D-Type flip flop 804 which also receives a clock-bar signal and provides a further output signal.

The XOR gate 105 takes as input the data signal via settable delay 32 and the output from the first D-Type flip flop 802 via settable delay 33. XOR gate 106 takes as input the output from the first D-Type flip flop 802 and the output from the second D-Type flip flop 804. Settable delays 32, 33 each also receive as input a delay control signal.

Figure 8:
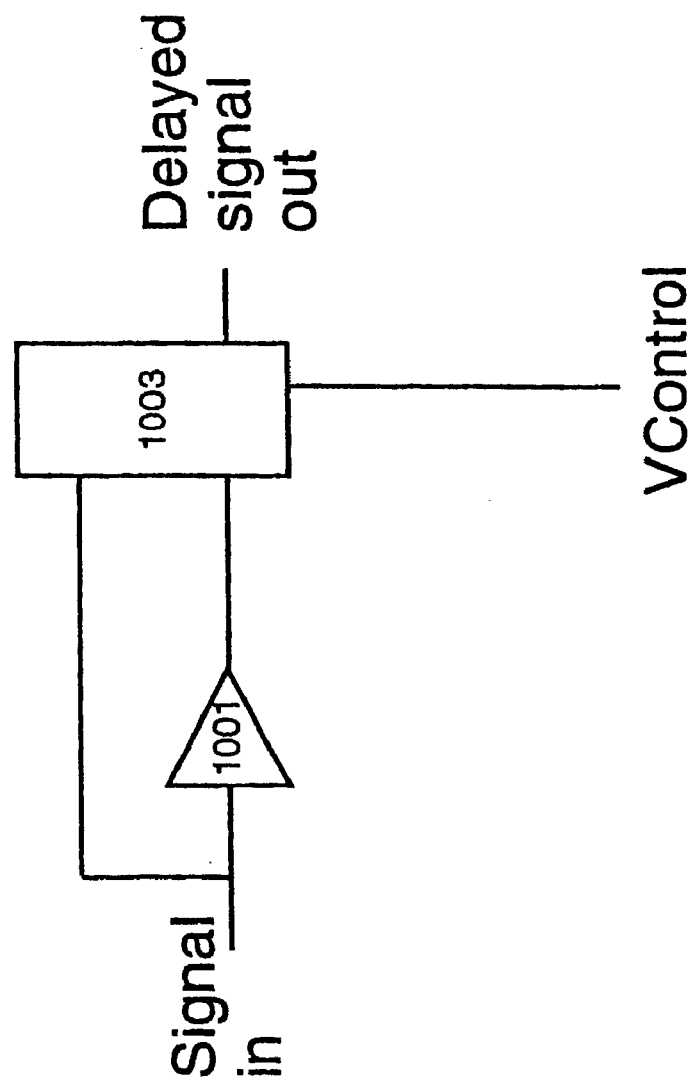
FIG. 8 shows an example of an adjustable delay circuit consistent with the present invention.

Referring now to FIG. 8, there is shown an example of a delay element suitable for use in the present invention. The delay element shown comprises a buffer 1001 and a 2:1 multiplexor circuit 1003.

The 2:1 multiplexor unit blends a fraction of the received signal with a fraction of a delayed copy, giving stepless delay adjustment, the proportions being determined by a control signal, Vcontrol. Individual delay circuits could comprise one or more amplifiers or a physically long conductor.

Other methods of constructing settable delays are known and could be employed in place of the example given above.

Figure 9:
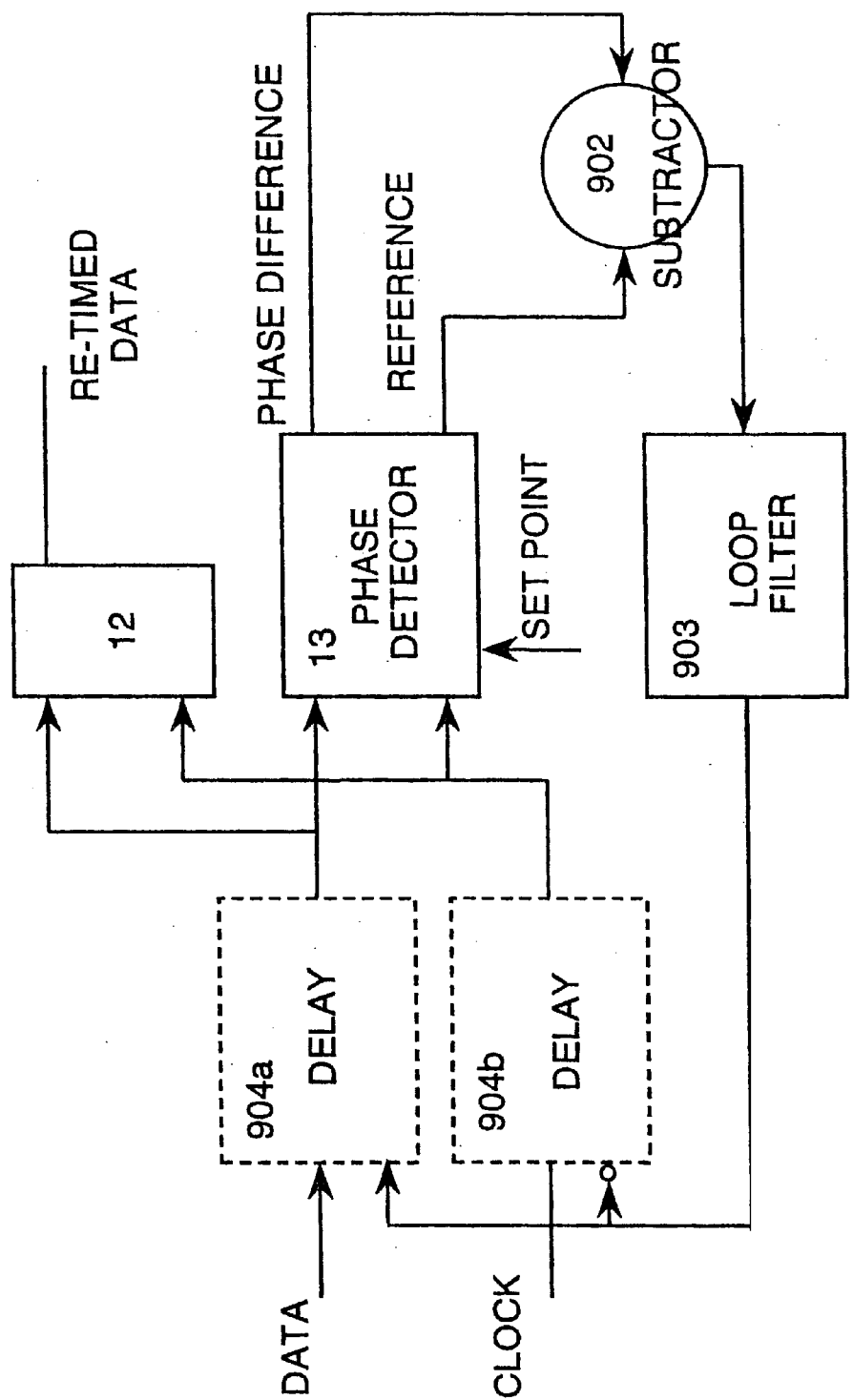
FIG. 9 shows a delay locked loop data-retiming circuit comprising a phase detector according to the present invention.

A phase detector embodying the present invention may be provided as part of a delay-locked loop circuit to control data and/or clock delay to re-time a data signal and an example of such a circuit is shown in FIG. 9, comprising: first and second adjustable delays 904a–b (for example, voltage controlled delays), a decision circuit 12, a phase detector 13, a subtractor 902, and a loop filter 903.

A clock signal is provided via adjustable delay 904b as input both to the phase detector 13 and as the clock input to decision circuit 12. In addition, a data signal is provided via adjustable delay 904a as input both to the phase detector 13 and to the data input of decision circuit 12. A set point control signal is also provided to the phase detector 13.

The phase difference signal and reference signal output from the phase detector 13 are provided as inputs to the subtractor 902.

The output signal from the subtractor 902 is provided as input to the loop filter 903; output from the loop filter is provided as input to the adjustable delays 904a–b.

The signal output from decision circuit 12 is the re-timed data signal.

The feedback loop comprising subtractor 902 and loop filter 903 uses the phase difference information provided from the phase detector output signals to vary the length of delays 904a–b introduced in the data signal path and in the clock signal path so as to adjust the phase difference between the clock signal and the data signal. This acts to bring the phase difference in line with the set point. The decision circuit 12 acts to regenerate the data signal retimed in synchronisation with the clock signal.

It is not essential that both delay circuits 904a–b be present: it is sufficient that one be present. If both are present, then they should preferably be driven in opposite directions by the delay control signal from the loop filter, as illustrated in FIG. 9.

Alternatively 904b could be a resonant "phase adjust circuit" which avoids placing controllable delay elements in the full speed clock or data path. Other methods are also known.

The decision circuit 12 works best if there is a time offset between the clock signal pulse edges and where the actual decision is taken. This offset may be in either direction, forward or back, according to specific circumstances. The present invention facilitates setting and adjusting such an offset.

Figure 10:
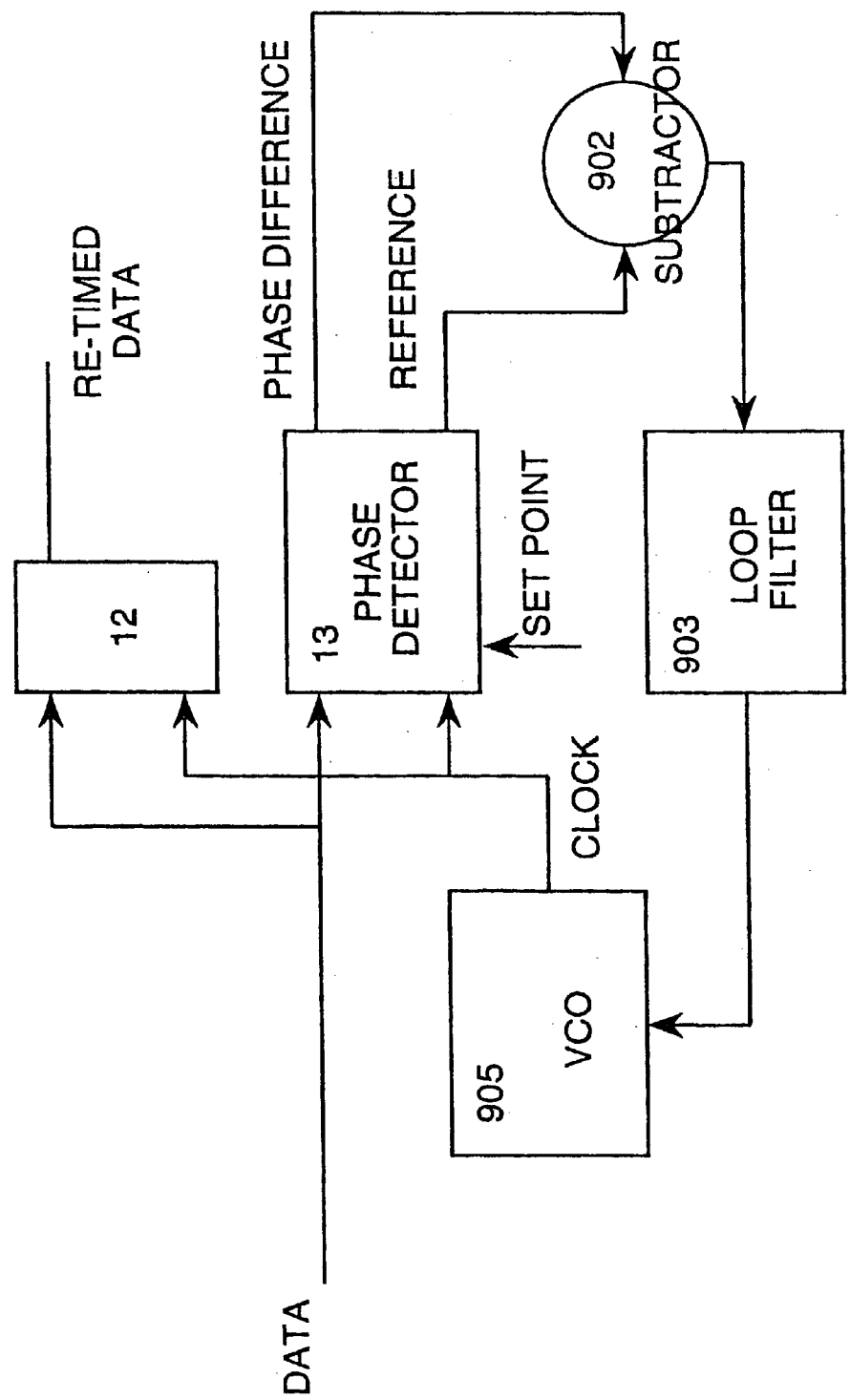
FIG. 10 shows a phase locked loop data-retiming circuit comprising a phase detector in accordance with the present invention.

FIG. 10 shows a similar phase-locked loop (PLL) circuit which might be used in place of the circuit of FIG. 9. The circuit differs from that of FIG. 9 in that delays 904a–b are omitted, and a Voltage-Controller Oscillator (VCO) 905 is added.

The output from the loop filter 903 is fed to the VCO 905 which provides an adjustable-frequency clock signal to the phase detector 13 and data-retiming circuit 12. This provides an alternative means of varying the clock signal phase with respect to the data signal phase as they are received by the phase detector and re-timing circuit.

Any range or device value given herein may be extended or altered without losing the effect sought, as will be apparent to the skilled person for an understanding of the teachings herein.

What is claimed is:

1. A digital signal phase detector comprising:

a data signal input for receiving a data signal;

a clock signal input for receiving a clock signal;

a set point control signal input for receiving a set point control signal indicative of a desired set point of the detector;

a first circuit coupled to said data signal input and said clock signal input and arranged to provide a phase difference signal representative of both the clock period of the clock and the difference in phase between the clock and the data signal;

a second circuit coupled to said data signal input and the clock signal input and arranged to provide a reference signal representative of the clock period of the clock signal;

wherein at least one of, said first and second circuits is coupled to said set point control signal and the corresponding output signal is representative of said set point control signal; and wherein a comparison of the phase difference signal with the reference signal provides an indication of the difference between the desired set point of the circuit and the phase difference between the clock and the data signal.

2. A phase detector according to claim 1 arranged such that timing of pulse edges in said output signal of said at least one of said first and second circuits varies responsive to said set point control signal.

3. A phase detector circuit according to claim 1 wherein said one of said first and second circuits comprises a first adjustable delay circuit coupled to said set point control signal, and arranged to introduce a signal delay responsive to said set point control signal, whereby to render the corresponding output signal of said one of said first and second circuits representative of said set point control signal.

4. A phase detector circuit according to claim 1 wherein each of said first and second circuits comprises an adjustable delay circuit coupled to said set point control signal, and arranged to introduce a signal delay responsive to said set point control signal, whereby to render the output signal of each of said first and second circuits representative of said set point control signal.

5. A phase detector according to claim 4 wherein said adjustable delay circuits are arranged to introduce oppositely-varying delays responsive to said set point control signal.

6. A phase detector circuit according to claim 3 wherein said one of said first and second circuits comprises a second adjustable delay circuit coupled to said set point control signal, and arranged to introduce a signal delay responsive to said set point control signal.

7. A phase detector according to claim 6 wherein said first and second adjustable delay circuits are arranged to introduce oppositely-varying delays responsive to said set point control signal.

8. A phase detector circuit according to claim 3 wherein said first adjustable delay circuit is arranged to introduce a delay of less than half of a clock cycle.

9. A phase detector circuit according to claim 3 wherein said first adjustable delay circuit receives a signal having pulse lengths greater than that of the input data signal.

10. A phase detector circuit according to claim 9 wherein said first adjustable delay circuit receives a signal having a pulse length at least twice that of the input data signal.

11. A phase detector circuit according to claim 1 comprising:
a data-reduction circuit arranged to provide a reduced data signal which changes state upon receipt of either only rising or only falling state transitions in a digital input signal;
a resynchronisation circuit arranged to provide a resynchronised reduced data signal upon receipt of a clock input signal and the reduced data signal;
a first shift register circuit arranged to provide a first phase-shifted resynchronised reduced data signal upon receipt of the resynchronised reduced data signal and one or more clock signals;
a second shift register circuit arranged to provide a second phase-shifted resynchronised reduced data signal upon receipt of the first phase-shifted resynchronised reduced data signal and one or more clock signals;
a first Exclusive OR circuit arranged to provide a phase difference signal upon receipt of the reduced data signal and the first phase-shifted resynchronised reduced data signal; and a second Exclusive OR circuit arranged to provide a reference signal upon receipt of the resynchronised reduced data signal and the second phase-shifted resynchronised reduced data signal;
an adjustable delay circuit arranged to provide a variably delayed output signal upon receipt of an input signal, responsive to a set point control signal; and
wherein said adjustable delay circuit is arranged to delay one of said reduced data signal, said resynchronised reduced data signal, said first phase-shifted resynchronised reduced data signal, and said second phase-shifted resynchronised reduced data signal.

12. A phase detector according to claim 11 wherein:
the data-reduction circuit comprises a D-Type flip flop;
the resynchronisation circuit comprises a D-Type flip flop;
the first shift register circuit comprises a Latch;
the second shift register circuit comprises a Latch;
the first XOR circuit comprises an XOR gate; and
the second XOR circuit comprises an XOR gate.

13. A phase detector circuit according to claim 11 comprising:
a second adjustable delay circuit arranged to provide a variably delayed output signal upon receipt of an input signal, responsive to a set point control signal; and
wherein said adjustable delay circuit and said second adjustable delay circuit are each arranged to delay a distinct one of said reduced data signal, said resynchronised reduced data signal, said first phase-shifted resynchronised reduced data signal, and said second phase-shifted resynchronised reduced data signal.

14. A phase detector according to claim 13 wherein said adjustable delay circuit and said second adjustable delay circuit are arranged to introduce oppositely varying delays responsive to said set point control signal.

15. A phase detector circuit according to claim 13 wherein said adjustable delay circuit is arranged to delay said reduced data signal and said second adjustable delay circuit is arranged to delay said first phase-shifted resynchronised reduced data signal.

16. A phase detector according to claim 15 wherein said first and second adjustable delay circuits are arranged to introduce oppositely varying delays responsive to said set point control signal.

17. A phase-locked loop circuit having a set point and comprising:
a phase detector circuit according to claim 1;
a loop filter and adjustable oscillator circuit arranged to provide said clock signal responsive to receipt of an output signal from said phase detector; and
wherein the set point of said phase-locked loop circuit is responsive to said set point control signal.

18. A phase-locked loop circuit according to claim 17 wherein said loop filter and adjustable oscillator circuit comprises:
a subtractor circuit which provides a difference signal output responsive to said phase difference and reference signals;
a loop filter circuit which provides a filter output signal responsive to said difference signal;
an adjustable clock signal circuit which provides said clock signal responsive to said filter output signal.

19. A delay-locked loop data re-timing circuit comprising:
a phase detector circuit according to claim 1;
a decision circuit arranged to provide a re-timed data signal upon receipt of said clock signal and said data signal; and a feedback circuit arranged to receive said phase difference signal, said reference signal, and said data signal and to delay said data signal responsive to said phase difference signal and said reference signal, whereby to control the phase of said data signal prior to its delivery to said phase detector circuit and said decision circuit and to vary the set point of the phase detector.

20. A data re-timing circuit comprising:

a phase detector circuit according to claim 1;

a decision circuit arranged to provide a re-timed data signal upon receipt of said clock signal and said data signal; and a feedback circuit arranged to receive said phase difference signal and said reference signal and to provide said clock signal to said phase detector circuit and said decision circuit responsive to said phase difference signal and said reference signal, whereby to control the phase of said clock signal prior to its delivery to said phase detector circuit and said decision circuit and to vary the set point of the phase detector.

21. A system for the purposes of digital signal processing comprising a phase detector circuit according to claim 1.

22. A method of digital signal phase detection comprising the steps of:

providing a data signal;

providing a clock signal;

providing a set point control signal indicative of a desired set point;

providing a phase difference signal responsive to and representative of both the period of the clock signal and the difference in phase between the clock signal and the data signal;

providing a reference signal responsive to and representative of the period of the clock signal;

wherein at least one of said phase difference signal and reference signal is also responsive to and representative of said set point control signal; and comparing the phase difference signal with the reference signal whereby to provide an indication of the difference between the desired set point and the phase difference between the clock and the data signal.

23. A method according to claim 22 wherein each of said phase difference signal and reference signal is responsive to and representative of said set point control signal.

24. A method according to claim 22 wherein the signal pulse edge timing of at least one of said phase difference signal and reference signal is responsive to and representative of said set point control signal.

25. A method according to claim 24 wherein each of said phase difference signal and reference signal is responsive to and representative of said set point control signal.

26. A method according to claim 24 wherein timing of rising pulse edges and falling pulse edges of said at least one of said phase difference signal and reference signal varies oppositely responsive to said set point control signal.

* * * * *